(12) United States Patent
Rozenblit et al.

(10) Patent No.: US 8,451,960 B2
(45) Date of Patent: May 28, 2013

(54) TRANSMITTER GAIN CONTROL AND CALIBRATION

(75) Inventors: Dmitriy Rozenblit, Irvine, CA (US); Masoud Kahrizi, Irvine, CA (US); Morten Damgaard, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 454 days.

(21) Appl. No.: 12/771,559

(22) Filed: Apr. 30, 2010

(65) Prior Publication Data

US 2011/0268216 A1    Nov. 3, 2011

(51) Int. Cl.
*H04L 27/08* (2006.01)
(52) U.S. Cl.
USPC ......... 375/345; 375/297; 455/127.2; 330/278

(58) Field of Classification Search
USPC ....... 455/127.2, 127.3; 375/345, 297; 367/65; 330/78
See application file for complete search history.

(56) References Cited

U.S. PATENT DOCUMENTS

2005/0133467 A1* 6/2005 Trachewsky et al. ......... 210/803
2011/0221523 A1* 9/2011 Dupis et al. ................... 330/129

* cited by examiner

*Primary Examiner* — Curtis Odom
(74) *Attorney, Agent, or Firm* — Sterne, Kessler, Goldstein & Fox P.L.L.C.

(57) ABSTRACT

Embodiments provide improved systems and methods of gain control and calibration for wireless transmitters. In particular, embodiments allow linear gain control over the entire transmitter gain control range, independent of temperature/process variations. Embodiments require very low power consumption compared to existing approaches. Embodiments may also be used for gain control calibration during production time, thereby substantially reducing production calibration time and cost.

10 Claims, 4 Drawing Sheets

TRANSMITTER GAIN CONTROL AND CALIBRATION

BACKGROUND

1. Field of the Invention

The present invention relates generally to gain control and calibration of transmitters.

2. Background Art

3G/4G wireless protocols require power control on the handset (also known as user equipment (UE) in 3G/4G) to increase the overall throughput of the wireless network. This requirement is divided into two cases. In the first case, the handset should be capable of setting its output power to a specific value. The power control tolerance in this case is not stringent (e.g., 8-9 dB) and can be met by good design practice. In the second case, called inner loop power control, the handset should be able to adjust its output power in accordance with a transmit power command (TPC) received from a base station. In 3G, the inner loop power step is defined as the relative power difference between the mean power of the original (reference) timeslot and the mean power of the target timeslot in each carrier, not including the transient duration. The transient duration is defined as the duration from 25 μsec before the slot boundary to 25 μsec after the slot boundary.

3G/4G protocols allow a maximum error of ±0.5 dB in gain over all conditions (e.g., temperature, process, VSWR, supply voltage, etc.) when a 1 dB power level change is made. This gain step accuracy should be met over the entire transmitter power control range of 80 dB or higher.

Another critical requirement for transmitter design for 3G/4G is power consumption, which governs the amount of time that the handset can be used without re-charging. DG09 current is a common metric used in the industry to calculate current consumption based on a 3G user profile. DG09 places the most emphasis on the power levels at which the handset is operated for largest percentage of time. Accordingly, in order to reduce DG09 current consumption, a common practice in today's transmitter design is to switch on/off various analog blocks of the transmitter chain for different output power levels.

The majority of conventional gain control and correction schemes for 3G/4G transmitter chains are based solely on open loop control, where power control relies on accurate characterization and/or factory calibration of analog gain steps within the transmitter chain in order to meet the aforementioned gain step accuracy of ±0.5 dB for a 1 dB power level change. In particular, these conventional designs rely on look up tables for storing the characterization/calibration results and applying them during normal operation. While some conventional schemes also use closed loop power control (using the coupler and detector of the power amplifier), they generally limit closed loop power control to operation at higher output power levels (e.g., above 5-8 dBm) due to the low linear dynamic range of the detector. In addition, certain conventional solutions involve complicated designs in order to restrict potential analog gain variations (due to temperature, frequency, bias, etc.) to meet performance requirements such as noise and linearity, for example.

Hence, existing gain control and calibration approaches significantly complicate the design of transmitter circuitry, make maintaining performance over large volume production more difficult, and require additional verification during production ATE testing.

Accordingly, there is a need for improved gain control and calibration techniques for 3G/4G transmitters.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Embodiments of the present invention provide improved systems and methods of gain control and calibration for wireless transmitters. In particular, embodiments allow linear gain control over the entire transmitter gain control range, independent of temperature/process variations. Further, embodiments require very low power consumption compared to existing approaches. Embodiments may also be used for gain control calibration during production time, thereby substantially reducing production calibration time and cost.

Figure 4:
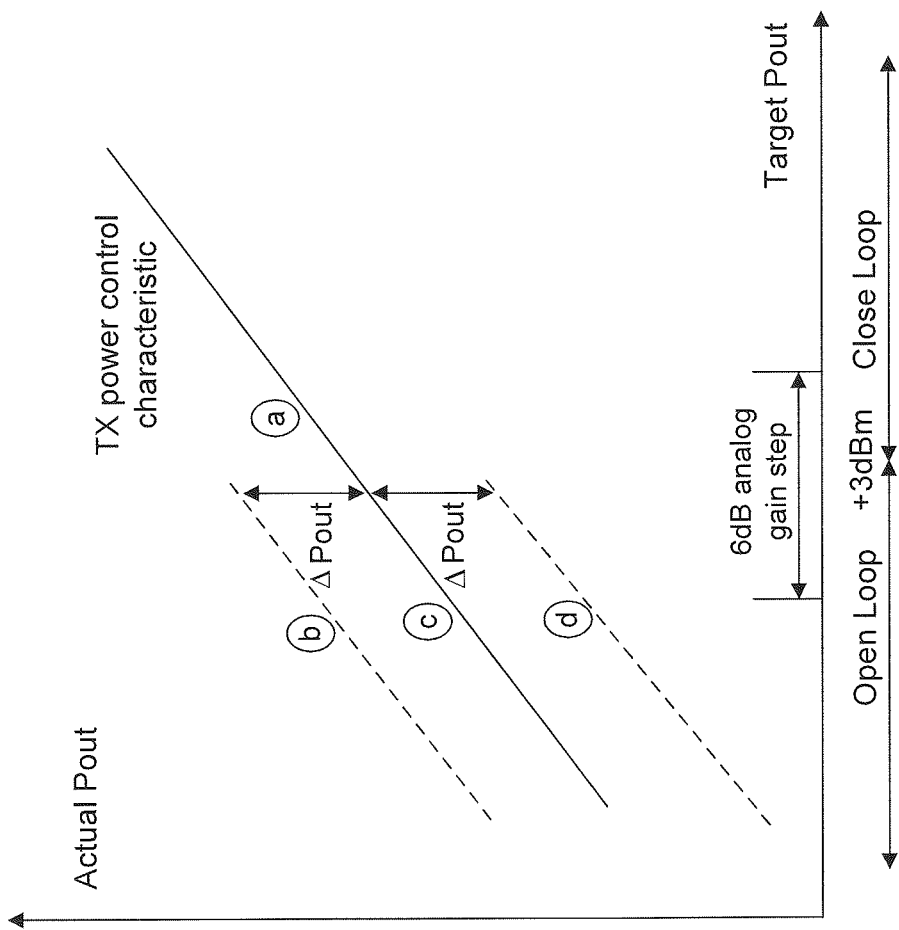
FIG. 4 illustrates an example power control characteristic of a transmitter.

FIG. 4 illustrates an example power control characteristic of a transmitter. The power control characteristic is a representation of actual output power as a function of target output power. Generally, differences between the actual output power and the target output power are due to inaccuracies/variations of analog gain steps of the transmitter (notwithstanding a DC offset that may be added to the actual output power).

As shown in FIG. 4, the transmitter can be operated in two power control modes: close loop power control (CLPC) and open loop power control (OLPC). In CLPC, the target output power is sufficiently high that the actual output power can be measured with accuracy using an output power detector (typically located within the power amplifier (PA) of the transmitter). As a result, the actual output power measurement can be used (via feedback) to correct for any differences between the actual output power and the target output power. In OLPC, the target output power is not sufficiently high to allow accurate measurement of actual output power using the output power detector, or is low enough that any measurement of actual output power using the output power detector is meaningless (i.e., the actual output power is outside the dynamic range of the output power detector). Thus, when the transmitter is operated uncompensated in OLPC mode, the actual TX power control characteristic of the transmitter can exhibit an upward or downward shift from a desired TX power control characteristic, resulting in inaccuracies in the actual output power of the transmitter (in FIG. 4, the desired TX power control characteristic is the (c) line, and the actual TX power control characteristic can be the (b) or (d) dashed lines, for example).

In 3G/4G protocols, the transmitter is expected to vary its actual output power and to transition from OLPC mode to CLPC mode, and vice versa, frequently and using various gain steps. When the transmitter performs gain changes using its digital control module, no gain accuracy problems arise. However, whenever the transmitter requires activation/deactivation of an analog gain module to change its output power, the inaccuracy/variations (over temperature, process, etc.) of the analog gain module can cause inaccuracy in the actual output power of the transmitter. This is particularly problematic when a 1 dB output power level change requires activation/deactivation of an analog gain step, because of the stringent ±0.5 dB error tolerance imposed by 3G/4G protocols in that case. In particular, the problem arises when such 1 dB output power level change involves a transition from CLPC to an uncompensated OLPC (or within OLPC).

As discussed above, conventionally, compensation of the TX power control characteristic in OLPC mode (or for transitions between CLPC and OLPC) is done by relying on a priori characterization/calibration of the analog gain steps. However, this solution is both time consuming and expensive, and may not compensate for unanticipated gain variations of analog steps. Embodiments of the present invention, as further described below, provide solutions that do not rely on a priori characterization/calibration, thereby resulting in significant savings in terms of design, testing, and cost.

Figure 1:
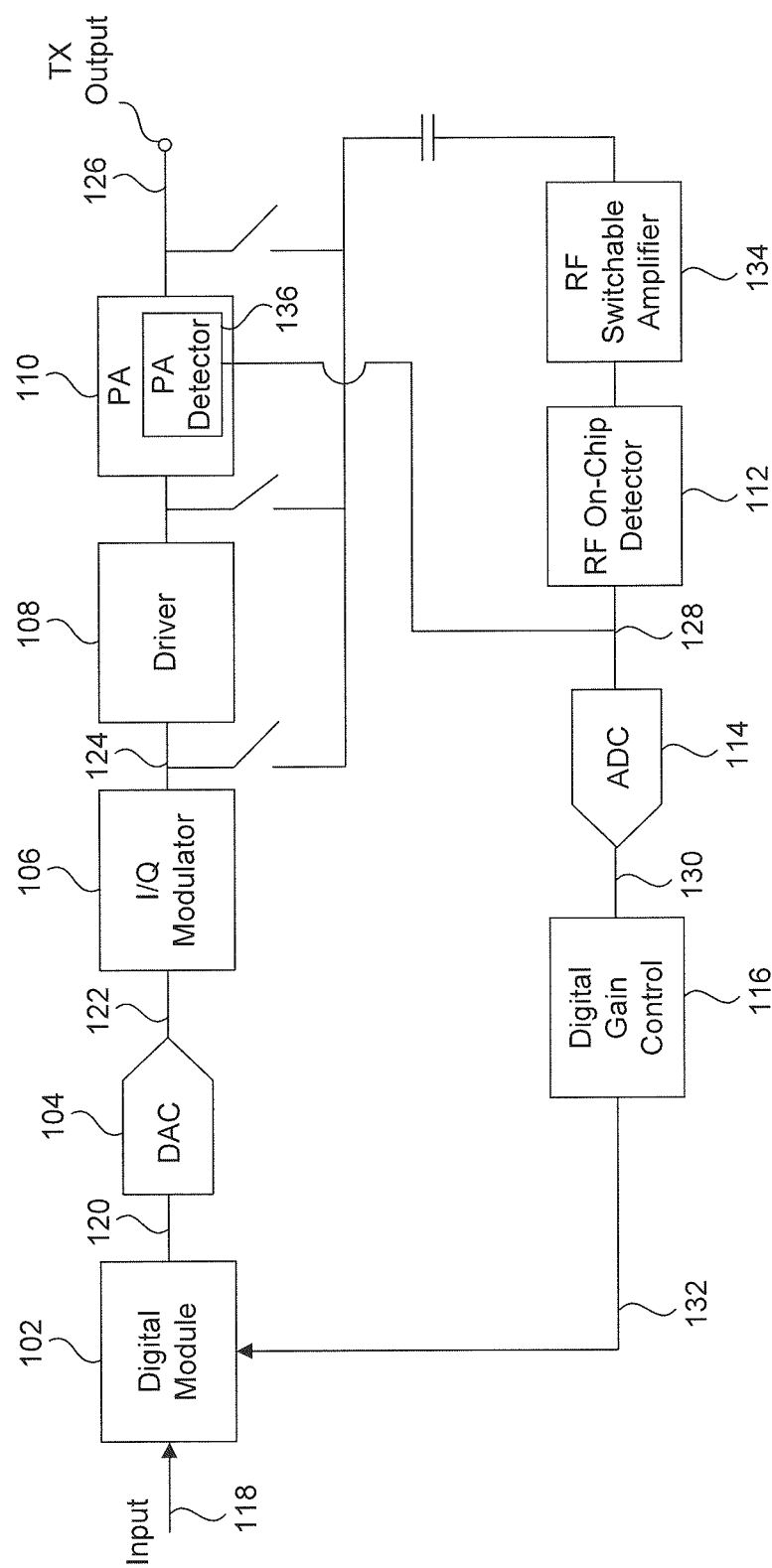
FIG. 1 illustrates an example transmitter chain according to an embodiment of the present invention.

FIG. 1 illustrates an example transmitter chain 100 according to an embodiment of the present invention. As shown in FIG. 1, example transmitter chain 100 includes a feed-forward path and a feedback path. In the feed-forward path, transmitter chain 100 includes a digital module 102, a Digital-to-Analog Converter (DAC) 104, an I/Q modulator 106, a driver stage 108, and a power amplifier (PA) 110. In the feedback path, transmitter chain 100 includes an RF switchable amplifier 134, an RF on-chip detector 112, an Analog-to-Digital Converter (ADC) 114, and a digital gain control circuit 116.

Example transmitter 100 may operate in OLPC mode or CLPC mode depending on the target output power level and the dynamic range of a PA power detector 136, contained in PA 110.

Digital module 102 receives an input signal 118. Typically, input signal 118 is a baseband representation of a desired output signal to be generated by transmitter chain 100. In an embodiment, input signal 118 includes in-phase (I) and quadrature-phase (Q) components of the desired output signal. Based on input signal 118, digital module 102 generates a digital output signal 120, including digital information for generating the desired output signal using subsequent analog components of transmitter chain 100.

Digital output signal 120 is converted from digital to analog using DAC 104, and then provided in analog form 122 to EQ modulator 106. EQ modulator 106 performs frequency up-conversion of signal 122 to generate a radio frequency (RF) analog signal 124. Subsequently, RF analog signal 124 is gain amplified/attenuated by driver stage 108 and PA 110 to generate TX output signal 126, such that TX output signal 126 is at a desired power level.

Generally, feed-forward elements of transmitter chain 100 enable a wide gain control range of transmitter chain 100. For example, PA 110 provides a continuous gain control range of 10-17 dB via bias change. Driver 108 provides a discrete (i.e., stair step function) gain control range of approximately 15 dB via load current steering. EQ modulator 106 provides a discrete gain control range of approximately 32 dB via load current steering. Analog filters (not shown in FIG. 2) that generally sit between DAC 104 and EQ modulator 106 provide a discrete gain control range of approximately 8 dB. In addition, gain control can be performed using digital module 102 by digital scaling of input signal 118 to provide a gain control range of approximately 10 dB with very fine discrete gain steps. As would be understood by a person skilled in the art based on the teachings herein, the above gain control ranges are exemplary and are not limiting of embodiments of the present invention.

Accordingly, a dynamic range of up to 90 dB can be enabled using the feed-forward elements of transmitter chain 100, allowing transmitter chain 100 to satisfy the signal requirements of complex 3G/4G protocol waveforms such as WCDMA, EDGE, GSM, WiMAX, etc. However, while gain control using digital module 102 is generally very accurate and insensitive to temperature/process variations, this is not necessarily the case for analog components of transmitter chain 100. In fact, temperature/process variations may cause the actual gain step values of the analog components to vary from their nominal values. For instance, a discrete gain step of 3 dB using driver 108 may in fact be 3.5 dB or 2.5 dB, for example, due to temperature/process variations.

In addition to requiring a wide dynamic range, 3G/4G waveforms also impose stringent power level accuracy requirements. In particular, one requirement, as mentioned above, is that a 3G/4G compliant transmitter must enable a minimum power control step of 1 dB with accuracy of ±0.5 dB. For example, in varying the output power level from 6 dBm to 7 dBm, the resulting output power level cannot be higher than 7.5000 dBm or lower from 6.5000 dBm. It is noted that a more relaxed accuracy requirement applies when a larger power control step is being used. Typically, the 0.5 dB gain accuracy at 1 dB gain step can be easily attained when the 1 dB gain step is realized using digital module 102 only. However, in certain cases, realizing a 1 dB gain step may require the activation/deactivation of certain analog components of transmitter chain 100. As a result, attaining the ±0.5 dB gain accuracy becomes more challenging, particularly when relying on the feed-forward elements only of transmitter chain 100 (i.e., in transitions from CLPC to uncompensated OLPC or transitions within uncompensated OLPC).

According to embodiments, transmitter 100 is operated in CLPC mode when the target output power level is sufficiently high that the actual output power of transmitter 100 can be measured with accuracy using PA detector 136. As such, a feedback path comprising PA detector 136, ADC 114, and digital gain control module 116 is used to compensate for any differences (introduced, for example, by inaccuracies/variations of analog steps) between the actual output power of transmitter 100 and the target output power.

In particular, as shown in FIG. 1, in CLPC mode, PA detector 136 measures TX output signal 126 to generate a measured output level signal 128. In embodiments, PA detector 136 may be located within PA 110, as shown in FIG. 1, or outside of PA 110. Signal 128 is converted from analog to digital by ADC 114 and then provided in digital form 130 to digital gain control circuit 116. Based on signal 130, digital gain control circuit 116 generates control signal 132 for controlling the digital scaling gain of digital module 102 such that TX output signal 126 matches the target output power level. In an embodiment, setting the target output power level is done by adjusting the gain of the feedback path described of transmitter chain 100.

When the target output power level is not sufficiently high to be measured with accuracy using PA detector 136, transmitter 100 operates in OLPC mode. Accordingly, when a desired gain change requires activation/deactivation of an analog gain step, the actual output power level is initially set based on pre-determined values (which may incorporate a priori calibration/characterization of the analog gain step). In addition, however, embodiments still rely on PA detector 136 to correct for any differences between the actual output power level and the target output power level. In particular, when the target output power level (with the desired gain change) is still measurable using PA detector 136 (albeit not accurately), embodiments rely on PA detector 136 to compare two measurements of actual output power, one made with the gain change produced using digital module 102 (i.e., purely digital scaling) and the other made with the gain change produced with the analog gain step. Because the gain change produced using digital module 102 is error-free (compared to the desired gain change), when compared to the gain change produced by the analog gain step, any gain inaccuracy in the analog gain step can be determined and compensated for using the digital module 102.

In an embodiment, the above method includes the following steps. First, with the transmitter operating in OLPC, the required output power change is produced by digitally scaling input signal 118 using digital module 118 (in performing this step, the digital scaling level is increased or decreased from an initial value). The resulting output power is measured using PA detector 136, recorded (after some averaging time, e.g., 30 μsec), and then set as a target output power level. Then, the digital scaling level is returned to its initial level, and the analog gain step (which activation/deactivation is required) is activated/deactivated. The resulting output power is again measured using PA detector 136, and the measured output power level is provided to digital module 102. Digital module 102 compares the measured output power level with the target output power level, and applies corrective scaling to input signal 118 to compensate for any differences between the measured output power level and the target output power level.

The same method described above can also be used when the target output power level is sufficiently low that it is outside the measurement range of PA detector 136 (i.e., measurement of the output power level is not just inaccurate but meaningless). In that case, instead of relying, on PA detector 136, RF on-chip detector 112 is used. RF on-chip detector 112 is a RF envelope detector, and thus may provide a lower measurement range than PA detector 136. For example, PA detector 136 may be used when the target output power level is above 0 dBm, and RF on-chip detector 112 may be used when the target output power is below 0 dBm. In embodiments, depending on the target output power level and the dynamic range of on-chip detector 112, the point at which measurements are made can be varied to create the best measurement conditions (e.g., to ensure that the on-chip detector 112 is operating at the center of its dynamic range). For example, as shown in FIG. 1, multiple tap points (e.g., at output 124 of I/Q modulator 106, at output of driver 108, or at output of PA 110) are provided to feed into the input of RF on-chip detector 112. Further, a RF switchable amplifier 134 (with multiple programmable gain stages) may be used to amplify the input going into RF on-chip detector 112, as necessary. It is noted that because measurements are used for their relative values (and not their absolute values), absolute accuracy of the measurements by RF on-chip detector 112 is not required.

An example illustrating when the above described method may be used in an example CLPC to OLPC transition is provided below.

Assume that transmitter chain 100 is operating in CLPC mode and that a gain attenuation of 1 dB is required in the next timeslot that would cause transmitter 100 to transition to OLPC mode. Also, assume that digital scaling using digital module 102 may not be used to realize the gain attenuation because digital module 102 is already operating at the minimum of its range. As a result, realizing the 1 dB gain attenuation must be done by using a gain attenuation using an analog component (e.g., attenuation of 6 dB) followed by a gain increase using digital module 102 (e.g., gain increase of 5 dB) to realize a net attenuation of 1 dB. Because gain attenuation using the analog component may cause the ±0.5 dB gain accuracy requirement to be violated, the above method can be used to ensure that the digital module 102 compensates for any gain inaccuracies/variations of the analog component, so that the ±0.5 dB gain accuracy requirement is met.

It is noted that when transmitter chain 100 transitions to OLPC mode after the above method has been performed, the digital scaling level of digital module 102 encompasses both the gain increase to be realized using digital module 102 (e.g., 5 dB gain increase) and the difference between the nominal gain attenuation to be realized using the analog component (e.g., 6 dB attenuation) and the actual gain attenuation realized using the analog component. For example, if the nominal gain attenuation by the analog component is 6 dB and the actual gain attenuation by the analog component is 6.7 dB, digital module 102 would scale the input by an amount between 5.2 dB and 6.2 dB such that the net gain attenuation is between 1.5 dB and 0.5 dB, thus satisfying the ±0.5 dB gain accuracy on a 1 dB gain step.

As would be understood by a person skilled in the art based on the teachings herein, the above described operation of transmitter chain 100 may also be used when a net gain increase (e.g., 1 dB) is required and is realized using a large gain increase by an analog component followed by compensatory gain attenuation using digital module 102. An example method according to an embodiment of the present invention for performing the above described operation of transmitter chain 100 is now described with reference to FIG. 2.

Figure 2:
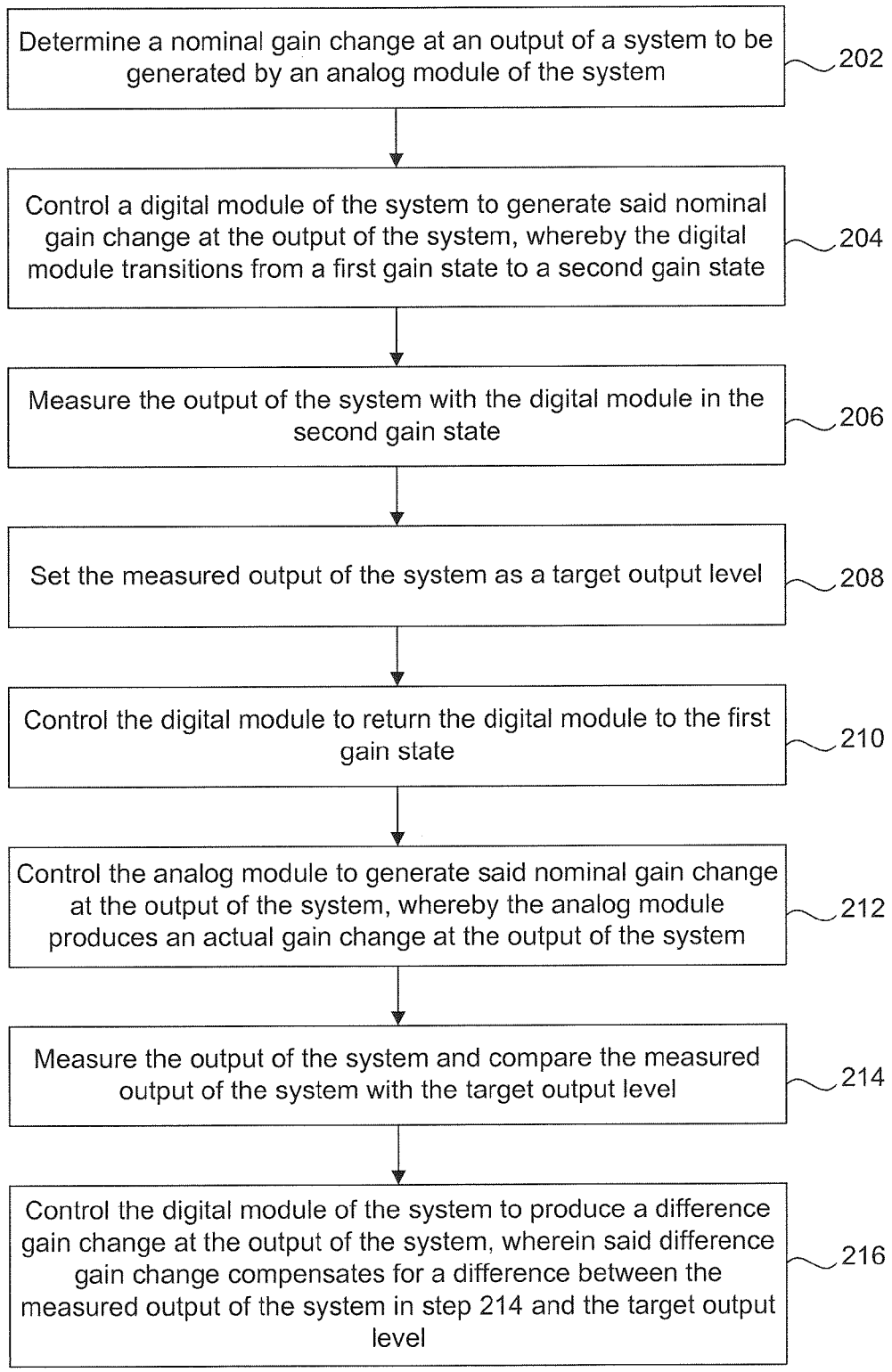
FIG. 2 is a process flowchart of a method of operating a transmitter chain according to an embodiment of the present invention.

FIG. 2 is a process flowchart 200 of a method of operating a transmitter chain according to an embodiment of the present invention.

Process 200 begins in step 202, which includes determining a nominal gain change to be generated by an analog module of the transmitter chain at an output of the transmitter chain. In an embodiment, step 202 is performed by digital module 102 of transmitter chain 100. For example, as described above, the nominal gain change may be a gain attenuation (e.g., 6 dB) or a gain increase to be realized by the analog module. In an embodiment, digital module 102 determines the amounts of gain increase/attenuation to be generated by both the digital module and the analog module, in order to realize a desired net gain increase/attenuation at the output of the transmitter chain.

Step 204 includes controlling a digital module of the transmitter chain to produce the nominal gain change at the output of the transmitter chain, whereby the digital module transitions from a first gain state to a second gain state as a result of step 204. For example, if in step 202 the nominal gain change is a 6 dB gain attenuation, step 204 includes digitally scaling the input by digital module 102 such that a 6 dB gain attenuation is produced at the output of the transmitter chain. It is noted that because digital module 102 is capable of very fine gain steps, the nominal gain change can be produced accurately at the output of the transmitter chain. It is also noted that step 204 may be performed despite the fact that digital module 102 may already be operating at the minimum/maximum of its dynamic range because as further described below step 204 is only a temporary step for the purpose of output signal measurement.

Step 206 includes measuring the output of the transmitter chain with the digital module in the second gain state. In other words, step 206 includes measuring the output of the transmitter with the nominal gain change realized at the output. In an embodiment, step 206 is performed using PA detector 136, and includes measuring the output of the transmitter chain over a pre-defined period (e.g., 30 µs) and averaging the measured output values to generate a mean output value. In another embodiment, step 206 is performed using RF on-chip detector 112 (i.e., calibration detector) and includes measuring an output within transmitter chain 100 (as described above, the measurement point may vary) which follows the analog module being activated/deactivated. For example, if the analog module being used to generate the nominal gain change is I/Q modulator 106, step 206 can be performed by measuring the output of I/Q modulator 106, driver 108, or PA 110.

Step 208 includes setting the measured output of the transmitter chain (e.g., the mean output value) as a target output power level of the transmitter chain. In an embodiment, as described above, step 210 includes adjusting the gain of the feedback path of transmitter chain 100 to set the target output power level. In another embodiment, the target output power level also encompasses the gain change to be realized by the digital module.

Subsequently, step 210 includes controlling the digital module to return the digital module to the first gain state. In other words, step 208 includes reversing the gain change realized using the digital module in step 204.

Step 212 includes controlling the analog module to generate the nominal gain change at the output of the transmitter, whereby the analog module produces an actual gain change at the output of the transmitter chain. As described above, because of temperature/process variations, for example, the actual gain change produced by the analog module may vary from the nominal gain change sought to be produced by the analog module.

Step 214 includes measuring the output of the transmitter chain and comparing the measured output with the target output power level. It is noted that the measurement at step 214 is performed at the same location as in step 206 above and using the same measurement element (i.e., PA detector 136 or RF on-chip detector 112).

Finally, step 216 includes controlling the digital module of the transmitter chain to produce a difference gain change at the output of the transmitter chain. The difference gain change compensates for the difference between the measured output of the transmitter chain in step 214 and the target output power level. It is noted that when the target output power level does not encompass the gain change to be realized by the digital module, the digital module will further apply said gain change after step 216, so that the net desired gain change at the output of the transmitter chain is realized.

In example implementation, process 200 described above can be performed during power change intervals, defined by 3G/4G protocols. In particular, 3G/4G protocols define specific time intervals during which power level can be changed. During these time intervals, signal requirements that are normally applicable (e.g., signal quality, noise floor, ACPR, etc.) are suspended. For example, the WCDMA protocol defines a 50 µs interval that straddles the WCDMA timeslot boundary and which is omitted from Error Vector Magnitude (EVM) measurements.

Figure 3:
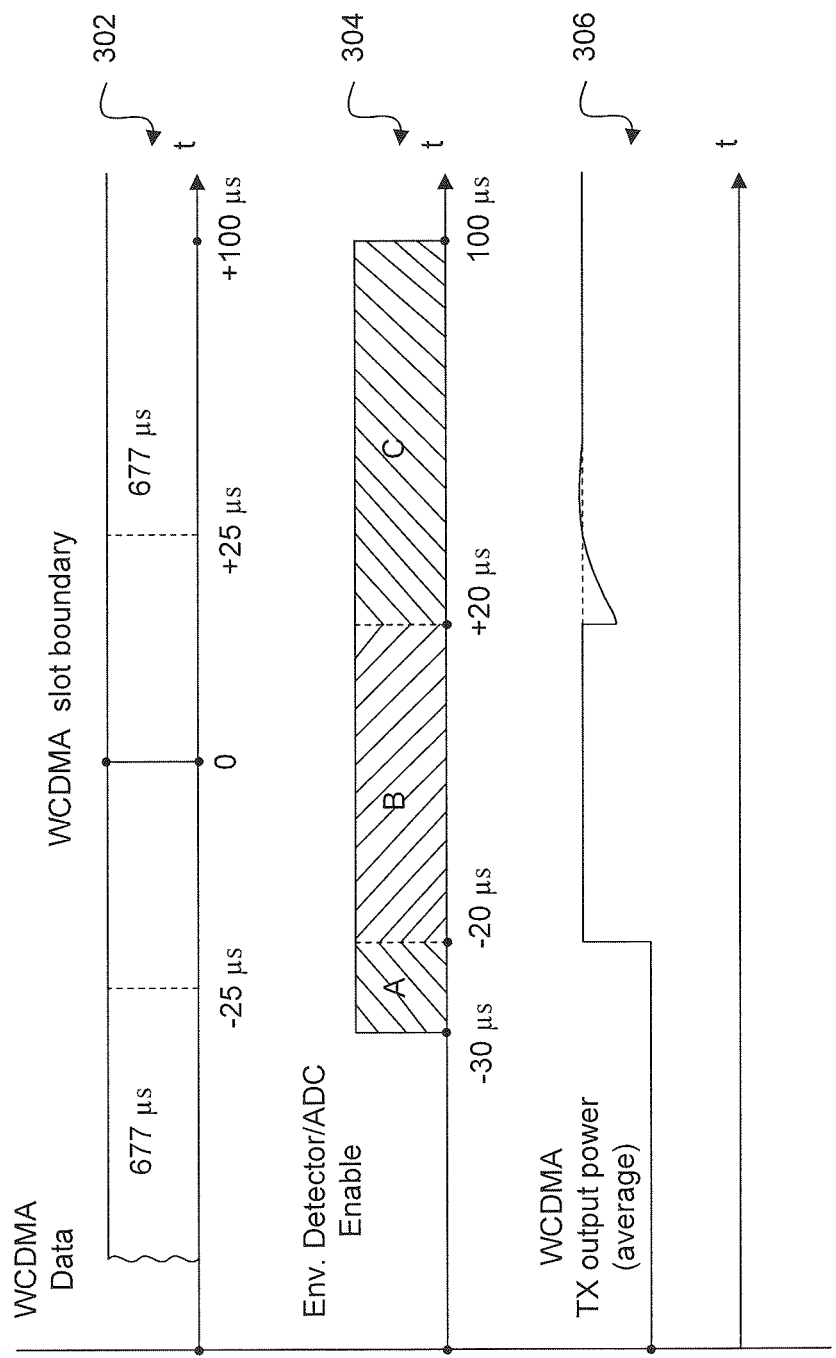
FIG. 3 illustrates example timing diagrams associated with operating a transmitter chain according to an embodiment of the present invention.

FIG. 3 shows example timing diagrams that illustrate performing a method similar to process 200 within the 50 µs power change interval of a WCDMA protocol waveform. In particular, FIG. 3 shows a first timing diagram 302 representative of a WCDMA channel, a second timing diagram 304 representative of different timing periods A, B, and C associated with the method of operation, and a third timing diagram 306 representative of the WCDMA TX output power.

As shown in FIG. 3, the method begins approximately 5 (at the −30 µs point) prior to the beginning of the 50 µs power change interval (the −25 µs point). In particular, having received information regarding a power change in the next timeslot, in the first timing region "A" the feedback path of the transmitter chain is enabled (e.g., PA detector 136 or RF on-chip detector 112, ADC 114, and digital gain control circuit 116, in addition to any supporting circuitry such as RF switchable amplifier 134 or other programmable gain amplifiers (PGAs) which are not shown in FIG. 1). In an embodiment, enabling the feedback path also includes taking estimates of the output power and enabling/disabling supporting circuitry (e.g., PGAs) to determine the optimal range of operation of the PA detector 136 or RF on-chip detector 112 and ADC 114. Concurrently with the actions described above, step 202 may be performed within timing region "A" to determine the nominal gain change to be generated by an analog component of the transmitter chain.

Subsequently, at the beginning of timing region "B" step 204 is performed to cause the nominal gain change to be realized at the output using the digital module. In an embodiment, step 204 is performed by setting the output of I/Q modulator 106 to realize the nominal gain change by adjusting the output level of DAC 104 via digital scaling. Then, for the duration of timing region "B" (approximately 40 µs), step 206 is performed to generate a mean output level value.

At the end of region "B" steps 208, 210, and 212 are performed. In particular, the measured output level is recorded and set as a target output level, the digital scaling (i.e., output of DAC 104) is set back at its initial level, and the analog component is enabled/disabled as necessary. Further, feedback loop control is enabled at the end of region "B." As described above, feedback loop control can be applied over the entire transmitter chain (i.e., with the feedback path including PA detector 1136) or for the RFIC portion only (i.e., with the feedback path including RF on-chip detector 112 coupled before PA 110). Preferably, feedback loop control is enabled before the +25 µs of the WCDMA waveform point to avoid issues like Peak Code Domain Error, for example.

Subsequently, over timing region "C", feedback loop control operation takes over and settles the transmitter chain output to the target output level via automatic adjustments of the digital gain such that the nominal gain change is accurately realized at the output. It is noted that because the process relies on output measurements taken within 50 µs of each other at the same point within the transmitter chain, the process is not affected by temperature/process/VSWR variations within the transmitter chain and further requires no calibration of the output/calibration detector used for the measurements.

As would be understood by a person skilled in the art based on the teachings here, embodiments of the present invention enable precise digital compensation of analog gain stages. In addition, embodiments can be used to enable self-calibration during production, thus minimizing production time and cost.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method of controlling a gain of a system having an analog module and a digital module, comprising:
   (a) determining a nominal gain change at an output of the system to be generated by the analog module;
   (b) controlling the digital module to generate said nominal gain change at the output of the system, whereby said digital module transitions from a first gain state to a second gain state;
   (c) controlling the digital module to return to the first gain state;
   (d) controlling the analog module to generate said nominal gain change at the output of the system, whereby the analog module produces an actual gain change at the output of the system; and
   (e) controlling the digital module to produce a difference gain change at the output of the system, wherein said difference gain change compensates for a difference between the nominal gain change and the actual gain change produced by the analog module.

2. The method of claim 1, further comprising:
   (f) measuring the output of the system with the digital module in the second gain state;
   (g) setting the measured output in step (f) as a target output level; and
   (h) measuring the output of the system after the actual gain change is produced at the output of the system in step (d);
   wherein said difference gain change compensates for a difference between the measured output of the system in step (h) and the target output level.

3. The method of claim 2, wherein controlling the digital module in step (e) comprises controlling the digital module such that a difference between a measurement of the output after step (e) and the target output level is lower than a maximum allowable error.

4. The method of claim 3, wherein the system is a transmitter, wherein the nominal gain change is greater than 1 dB, and wherein the maximum allowable error is ±0.5 dB.

5. The method of claim 1, wherein the nominal gain change is a gain attenuation or a gain increase to be realized by the analog module.

6. The method of claim 1, wherein controlling the digital module in steps (b), (d), and (e) comprises digitally scaling an input signal of the system.

7. The method of claim 1, wherein controlling the digital module in step (b) comprises generating a gain change at the output of the system substantially equal to the nominal gain change.

8. The method of claim 1, wherein the actual gain change produced by the analog module is different than the nominal gain change due to variations in the analog module.

9. The method of claim 1, wherein the system is a transmitter, and wherein the analog module is one or more of a modulator, a driver circuit, a power amplifier, and a filter.

10. The method of claim 1, wherein the system is a transmitter, and wherein the digital module is one or more of a baseband processor, a DAC, and a digital state machine.

* * * * *